United States Patent [19]

Minami et al.

[11] Patent Number: 4,642,571
[45] Date of Patent: Feb. 10, 1987

[54] MICROWAVE PULSE SOURCE

[75] Inventors: Kazuo Minami, Yokohama; Mitsuru Awano, Tokyo, both of Japan

[73] Assignee: Tokyo Institute of Technology, Tokyo, Japan

[21] Appl. No.: 753,631

[22] Filed: Jul. 10, 1985

[30] Foreign Application Priority Data

Jul. 18, 1984 [JP] Japan ................. 59-148871

[51] Int. Cl.⁴ .......................... H03K 3/55; H01P 7/06; H01J 17/64
[52] U.S. Cl. ..................................... 328/59; 307/106; 328/65; 331/96; 333/99 S; 333/99 PL; 333/230; 333/258
[58] Field of Search ............ 331/96, 74, 75, 184; 307/106; 328/28, 59, 65; 333/230, 227, 258, 99 S, 99 PL; 307/277

[56] References Cited

U.S. PATENT DOCUMENTS 4,227,153 10/1980 Birx ................. 333/258 X

OTHER PUBLICATIONS

Minami, "Proposed High-Power Microwave Source Using a Superconducting Cavity as an Energy Storage", Report IPPJ-T-30, Nagoya University, Japan, Nov. 1977.

Y. Bruynseraede et al., "Surface-Resistance Measurements in $TE_{011}$-Mode Cavities of Superconducting Indium, Lead and an Indium-Lead Alloy at Low and High RF Magnetic Fields", Physica, vol. 54 (1971), No. 2, Aug. 31, 1971, pp. 137-159.

Kobayashi et al., "Extraction of Microwave Pulses from a Superconducting Cavity by Gas Discharge Switch", J. Appl. Phys. 57 (1) Jan. 1, 1985, American Institute of Physics, pp. 105-109.

Primary Examiner—Siegfried H. Grimm
Attorney, Agent, or Firm—Spencer & Frank

[57] ABSTRACT

A superconducting cavity has a long time constant when the coupling factor of its output port is low so as to accumulate input microwave energy therein, and after a certain accumulation of the input microwave, an output microwave pulse with a large power is extracted from the cavity by suddenly increasing the coupling factor of its output port.

5 Claims, 13 Drawing Figures

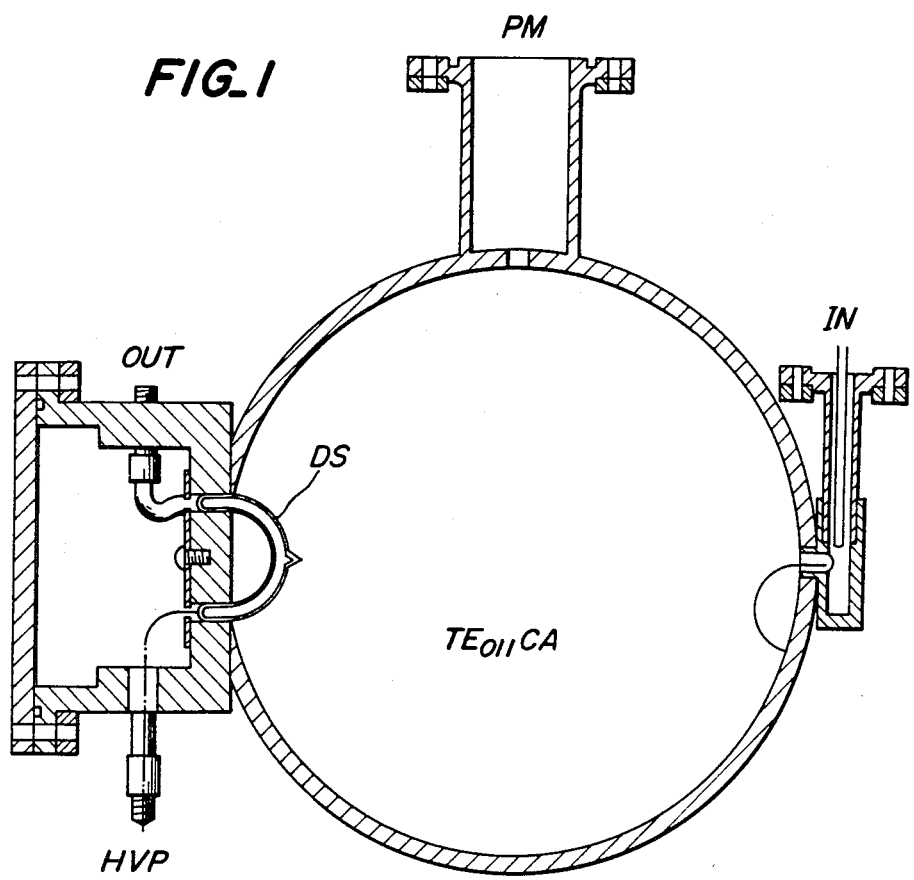
FIG_1
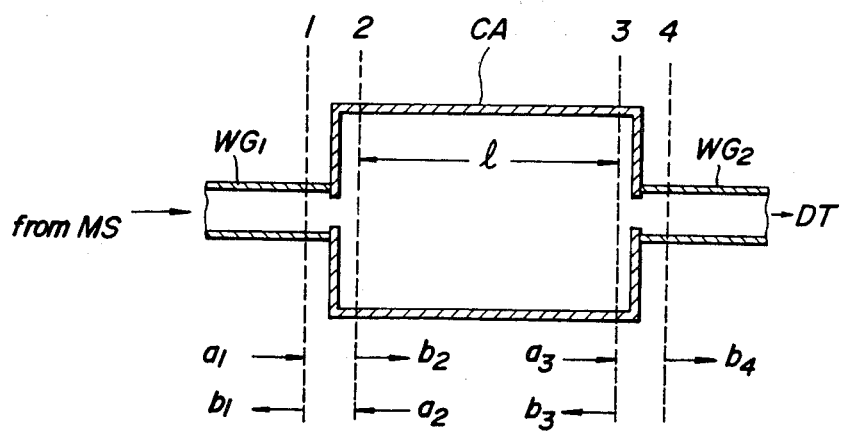
FIG_2

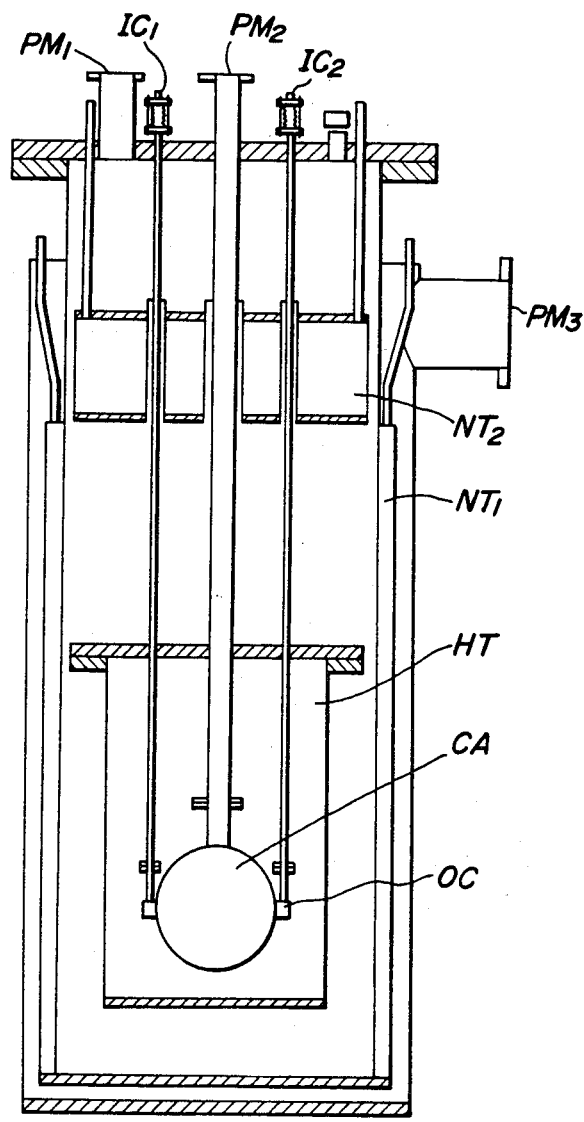
FIG_4

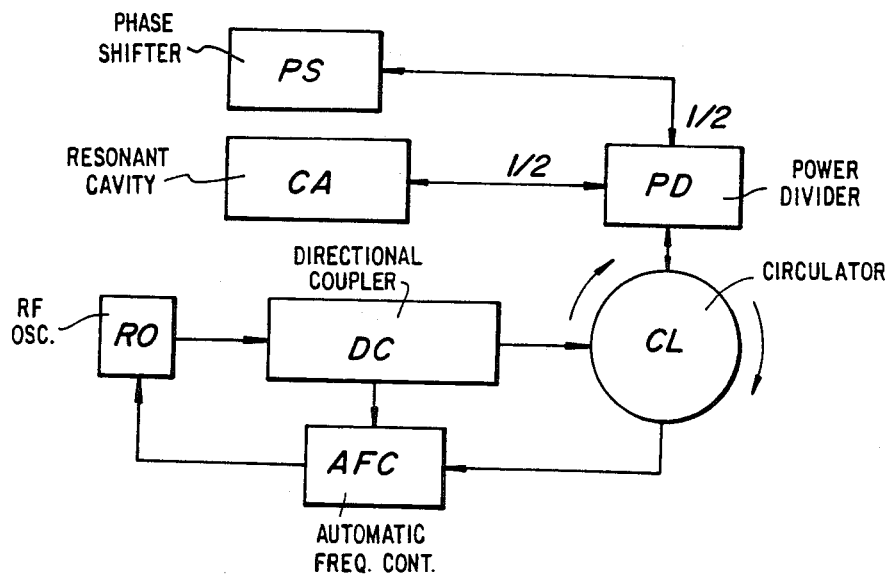
FIG_5
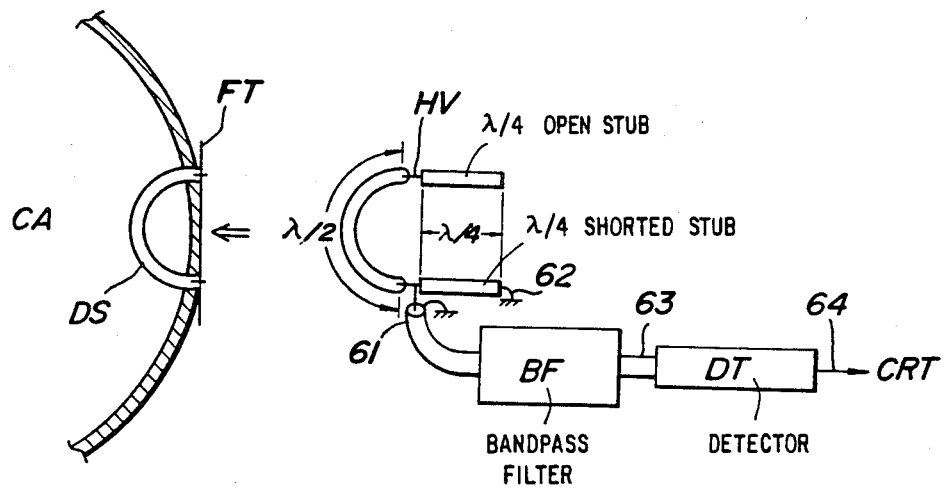
FIG_6

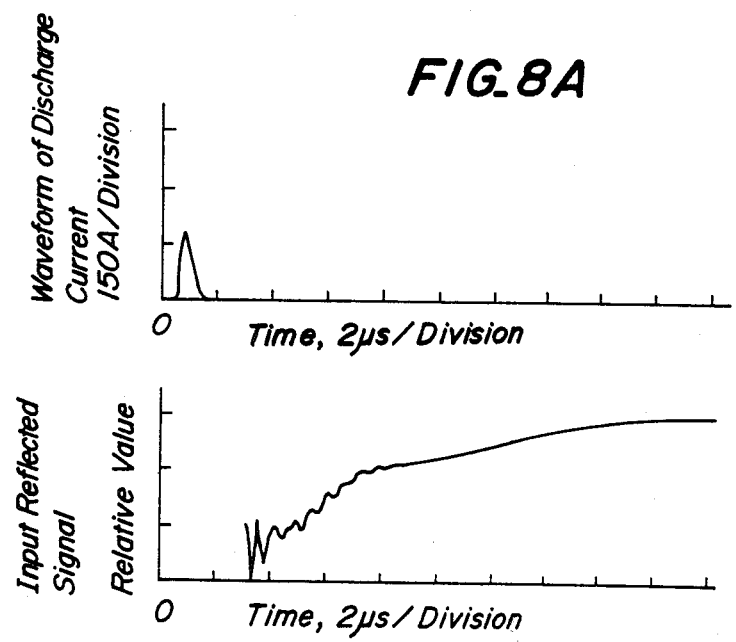
FIG_8A
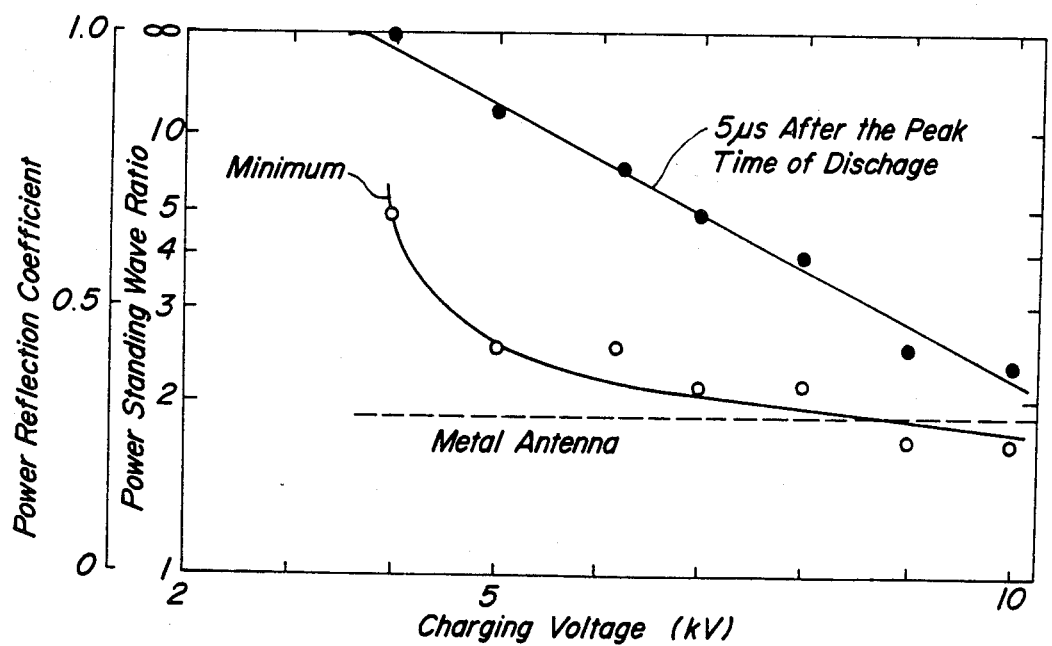
FIG_8B

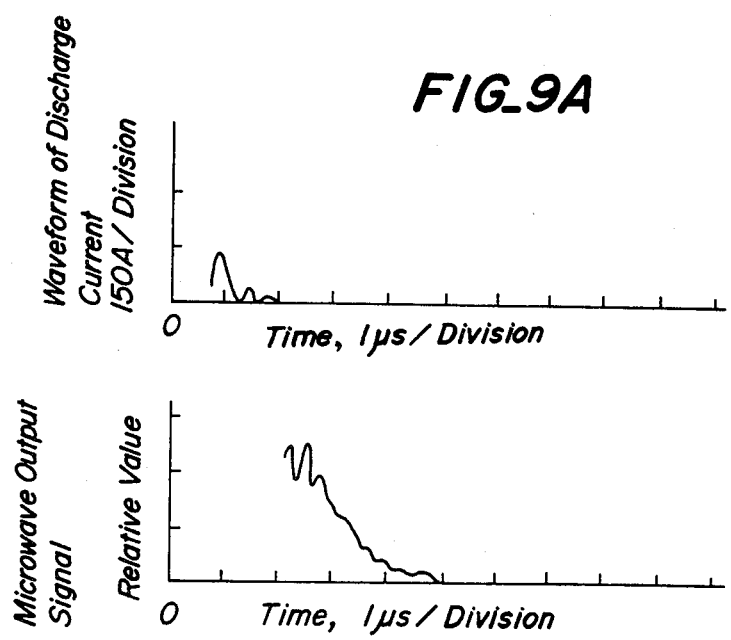
FIG_9A
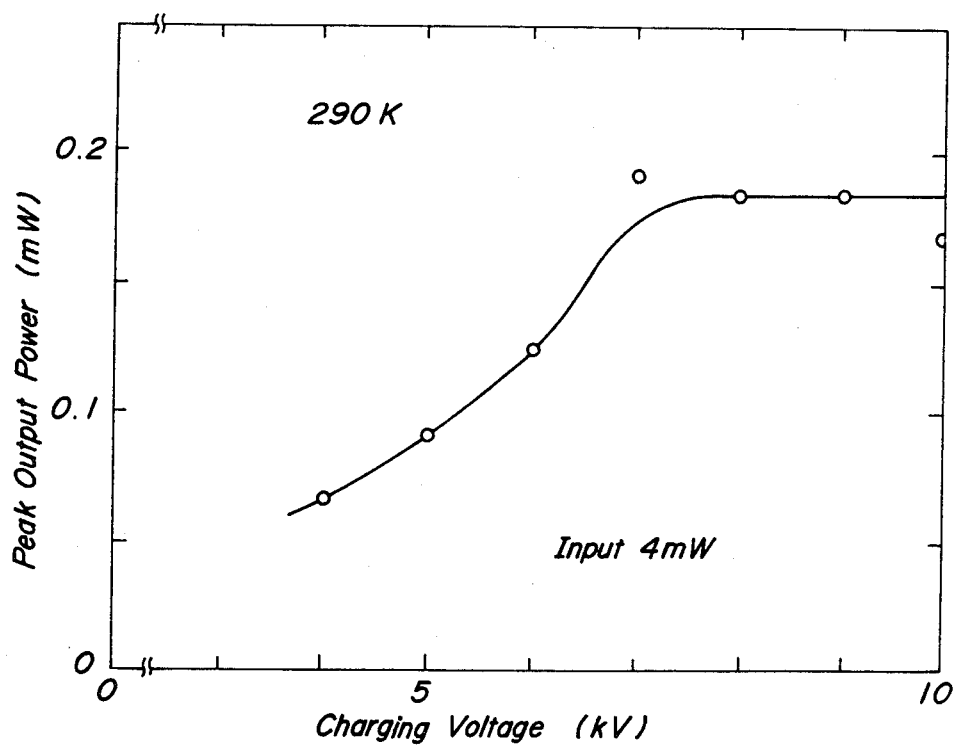
FIG_9B

FIG_10A
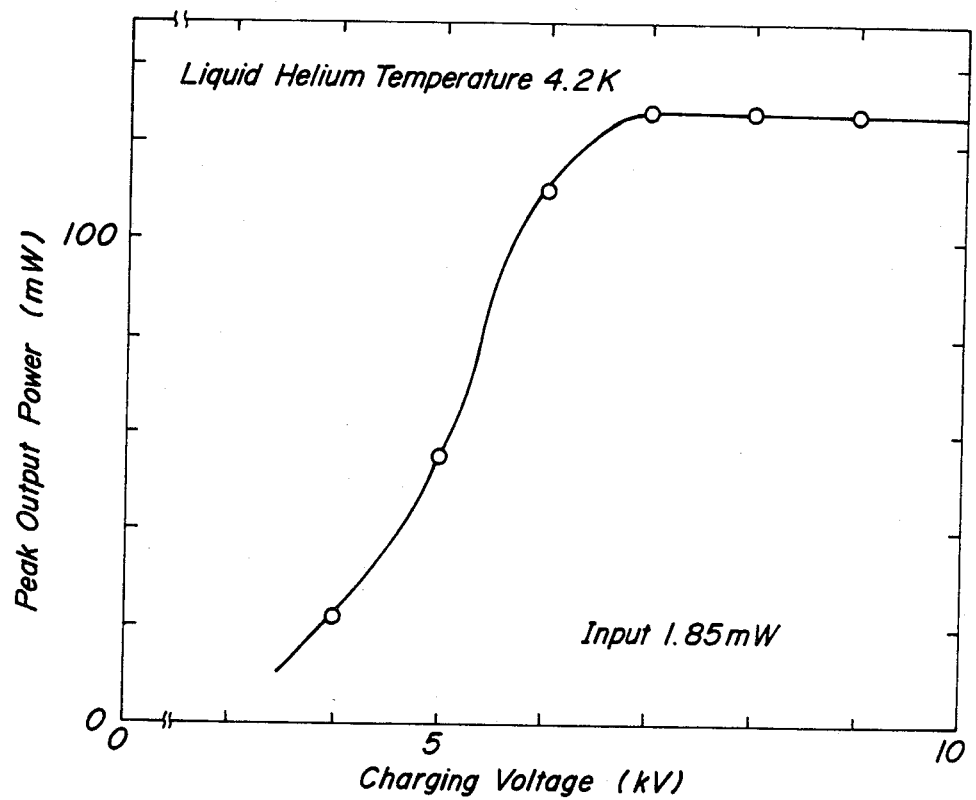
FIG_10B
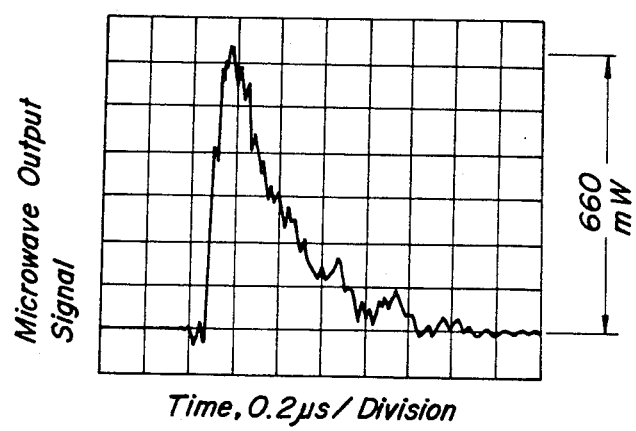

MICROWAVE PULSE SOURCE

BACKGROUND OF THE INVENTION

1. Field of the Invention

This invention relates to a microwave pulse source for generating microwave pulses, and more particularly to an economical microwave pulse source which is small in size yet capable of easily generating microwave pulses with a large power.

2. Description of the Prior Art

Oscillators capable of generating millimeter-wave pulses with a large power of several kW or more are required in millimeter wave radar and in scientific experiments such as nuclear fusion tests. For instance, in experiments using a medium sized tokamak fusion test reactor, if millimeter-wave pulses from a gyrotron are used at the rising time of electric current to cause the preliminary ionization at the electron cyclotron resonance frequency, the one-turn voltage for starting the discharge can be reduced to less than one half the value without the millimeter-wave pulse application, and the capacity of the core for the toroidal current can be reduced.

To generate high-power millimeter-wave pulses, klystrons and gyrotrons have been used heretofore. The devices of the prior art for generating such millimeter-wave pulses, however, have a shortcoming in that they are bulky because high-voltage sources and coils for producing strong magnetic fields are necessary.

SUMMARY OF THE INVENTION

Therefore, an object of the invention is to obviate the above-mentioned shortcoming of the prior art by providing an improved economical microwave pulse source which is small in size yet capable of easily generating microwave pulses with a large power.

Another object of the invention is to provide a microwave pulse source which generates high-power microwave pulses by accumulating microwaves and extracting the accumulated microwaves.

A preferred embodiment of the microwave pulse source according to the invention uses a superconducting cavity having an input port and an output port. To feed input microwaves to the cavity, an input coupler is disposed at the input port of the cavity, while an output coupler is disposed at the output port for extraction of an output microwave pulse from the cavity. For triggering the extraction of the output pulse, the output coupler carries a discharge tube which is mounted thereon in such a manner that degree of coupling of the output coupler is suddenly maximized upon the occurrence of a plasma in the discharge tube.

When the output coupler has a minimum degree of coupling, the cavity has a much longer time constant than that when the output coupler has a maximum degree of coupling. Accordingly, the input microwaves with a certain instantaneous power are accumulated in the cavity when the output coupler has the minimum degree of coupling. The output microwave pulse is extracted from the output port of the cavity by suddenly maximizing the degree of coupling of the output coupler through sudden generation of a plasma in the discharge tube. The power accumulated in the cavity is rendered to the thus extracted output microwave pulse, so that the power of the output microwave pulse is much higher than the instantaneous power of the input microwaves.

It is noted that the quality factor Q of the superconducting cavity is larger than that of a normal conducting cavity by a factor of more than a thousand and the amount of microwave energy to be accumulated in the cavity is proportional to the quality factor Q. Thus, the superconducting cavity can store more than a thousand times of microwave energy as compared with the case of a normal conducting cavity. Accordingly, if the microwave energy stored in the superconducting cavity is extracted in a short period of time, high-power microwave pulses can be generated in a much easier manner than conventional methods.

The inventors once disclosed a microwave pulse source of classical maser type (IPPJ-T-30, "PROPOSED HIGH-POWER MICROWAVE SOURCE USING A SUPERCONDUCTING CAVITY AS AN ENERGY STORAGE" by Kazuo MINAMI, November, 1977). For instance, microwave sources with continuous outputs of less than 1 W in a frequency range of 20–80 GHz, such as Gunn diodes and IMPATT diodes, are known, and they are very inexpensive elements. The inventors have been trying to provide a practicable small-sized microwave pulse source with an output in the order of several kW by combining the above microwave source elements and a superconducting cavity.

A number of studies have been made on the superconducting cavity itself in relation to the development of practicable superconducting linear accelerators, but there are few prior studies on the switching of microwave energy accumulated in the cavity. Such switching of the accumulated microwave energy is essential in the microwave pulse source of the invention. The inventors once reported the result of experiments on mechanical switching. The possible minimum switching time of the mechanical switching can be reduced only to about 1 ms, and the pulse power gain is limited to about 10 in case of the mechanical switching. Since the pulse power gain depends on the ratio of the energy accumulating time to the switching time and since the energy accumulating time depends on the magnitude of the quality factor Q, to increase the pulse power gain for a given Q of the cavity the switching time must be reduced as far as possible.

As a possible means for reducing the switching time, the inventors have carried out experiments on switching by using a discharge tube in a circuit for extracting a microwave pulse from a superconducting cavity carrying microwave energy accumulated therein. The experiments proved that microwave pulses with a duration in the order of 200 ns could be generated at a pulse power gain of about 350 times by the discharge switching. The present invention is based on the findings obtained by such experiments. The above-referred experiments, which used 2.86 GHz microwaves, were conducted as the basic experiments for the generation of microwave pulses.

BRIEF DESCRIPTION OF THE DRAWINGS

For a better understanding of the invention, reference is made to the accompanying drawings, in which:

FIG. 1 is a cross sectional view of the essential portion of a microwave pulse source according to the invention;

FIG. 2 is a schematic longitudinal sectional view of a resonant cavity for illustrating the principle of the invention;

FIG. 4 is a schematic diagram showing overall construction of a microwave pulse source according to the invention;

FIG. 5 is a block diagram of a frequency stabilizing circuit which is used in the microwave pulse source of the invention;

FIG. 6 is a block diagram of an output coupler circuit for the resonant cavity used in the microwave pulse source of the invention;

FIG. 8A and FIG. 8B are graphs showing the signal waveform and the power standing wave ratio charging voltage characteristics of the resonant cavity when the output coupler circuit is actuated;

FIG. 9A and FIG. 9B are graphs showing the signal waveform and the peak output power vs. charging voltage characteristics of the resonant cavity at room temperature, in which peak output power represents the accumulated microwave energy being extracted; and FIG. 10A and FIG. 10B are graphs showing the peak output power vs. charging voltage characteristics and the time variation of microwave output signal of the resonant cavity at a very low temperature, which peak output power represents the accumulated microwave power being extracted.

Figure 3:
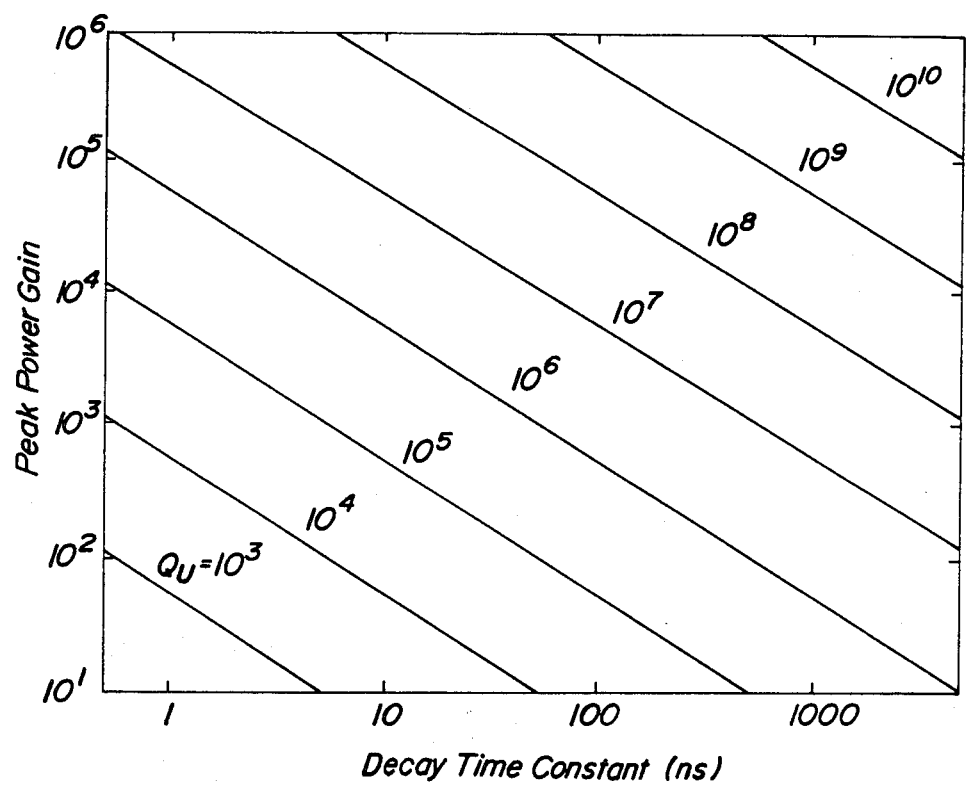
FIG. 3 is a graph showing the relationship between the peak power gain and the decay time constant in the resonant cavity of the microwave pulse source.

Throughout different views of the drawings, CA is a resonant cavity, $WG_1$ and $WG_2$ are waveguides, DT is a detector, MS is a microwave source, $IC_1$ and $IC_2$ are input circuits, OC is an output circuit, PM, $PM_1$, $PM_2$ and $PM_3$ are pumps, $NT_1$ and $NT_2$ are liquid nitrogen tanks, HT is a liquid helium tank, PS is a phase shifter, PD is a power divider, RO is a radio-frequency oscillator, DC is a directional coupler, CL is a circulator, AFC is an automatic frequency control (AFC) circuit, DS is a discharge tube, HV is a high voltage, FT is a filter, BF is a band-pass filter, and CRT is an oscilloscope with a cathode ray tube.

DESCRIPTION OF THE PREFERRED EMBODIMENT

The description of a preferred embodiment of the invention will be divided into the following sections.
I. Theoretical background
II. Experiments
  (II-1) Preparation of a cavity
  (II-2) Cryostat and vacuum pump means
  (II-3) Microwave circuit
  (II-4) Input/output portions of cavity
III. Analysis of the result of experiments
  (III-1) Discharge tube characteristics
  (III-2) Effect of discharge on radio-frequency output circuit from cavity
  (III-3) Power standing wave ratio of discharge tube antenna
  (III-4) Extraction of microwave pulse from room temperature cavity
  (III-5) Extraction of microwave pulse from superconducting cavity
  (III-6) Practicability of microwave pulse source of the invention
IV. Effects

I. THEORETICAL BACKGROUND

Prior to entering the detailed explanation of the illustrated embodiment, theoretical background of the microwave pulse generation according to the invention will be described.

In general, the analysis of a cavity has been made by assuming it as a lumped-constant equivalent circuit. In such analysis, although complete result can be obtained with respect to the cavity's response to outside circuits while assuming the cavity as a black box, the values of equivalent lumped constants of the cavity resonator cannot be calculated, and the relationship between the inherent parameters, such as the cavity dimensions, and the lumped constants cannot be determined. Complete analysis is possible only when S (scattering) matrices are used.

Referring to FIG. 2, let it be assumed that a two-port cavity CA is formed by closing opposite ends of a cylindrical waveguide with metallic plates and boring input and output ports through the metallic plates, so that waveguides $WG_1$ and $WG_2$ are connected to the input and output ports respectively. Each of the above waveguides has a uniform cross section, and the two metallic plates are spaced by a certain distance in the axial direction of the waveguide closed thereby.

The steady state conditions of the two-port cavity CA will be considered now. When an incident wave with an electromagnetic field amplitude $a_1$ is at the input port, i.e., the left-hand side port in FIG. 2, in a direction of the similarly marked arrow, traveling electromagnetic fields appear at planes 1, 2, 3 and 4 in the directions of the arrows and the magnitudes of such traveling fields are denoted by $a_2$, $a_3$, $b_1$, $b_2$, $b_3$ and $b_4$. The planes 1, 2, 3 and 4, which are called the planes of detuned short, are located at such positions where nodes are formed when non-resonant standing waves are produced. The planes 1 and 2 are located very close to the input port, while the planes 3 and 4 are located very close to the output port.

For simplicity, a resonant mode which is identical with the fundamental mode will be considered. Then, the distance $l$ between the two planes 2 and 3 becomes $l = \lambda_g/2$, $\lambda_g$ being the waveguide wavelength in the cavity. When a signal becomes incident to a port, the ratio of the signal which has passed the port to the incident signal is defined as the "coupling factor". The coupling factor at the input port is denoted by k and that at the output port is denoted by h. The input and output coupling factors k and h are constants which are inherent to the cavity CA. Since the ports of the cavity are reactance elements, the coupling factors and the amplitudes of the signals satisfy the following equations (1).

$$\left.\begin{array}{l} b_1 = -\sqrt{1-k^2}\, a_1 + jka_2 \\ b_2 = jka_1 - \sqrt{1-k^2}\, a_2 \\ b_3 = -\sqrt{1-h^2}\, a_3,\ b_4 = jha_3 \\ a_3 = -b_2 e^{-\alpha/2},\ a_2 = -b_3 e^{-\alpha/2} \end{array}\right\} \quad (1)$$

In the last two lines of the equation (1), $\alpha$ represents the attenuation of electromagnetic wave when the wave makes one round trip between the two planes 2 and 3 spaced by a distance $l$.

Since the quality factor Q of the cavity CA is assumed to be high, one can use the following approximations; namely, $\alpha \ll 1$, $k^2 \ll 1$ and $h^2 \ll 1$. If the amplitudes $b_1$, $b_2$ and $b_4$ are expressed in terms of the amplitude $a_1$ by using the equations (1) and the above approximations, the following equations (2) to (4) can be derived.

$$\frac{b_1}{a_1} = -\sqrt{1-k^2} + \frac{k^2\sqrt{1-h^2}}{1-e^{-\alpha}\sqrt{(1-k^2)(1-h^2)}} \approx -1 + \frac{k^2}{\alpha+(k^2+h^2)/2} \quad (2)$$

$$\frac{b_2}{a_1} = \frac{jk}{1-e^{-\alpha}\sqrt{(1-k^2)}} \approx \frac{jk}{\alpha+(k^2+h^2)/2} \quad (3)$$

$$\frac{b_4}{a_1} = \frac{-hke^{-\alpha/2}}{1-e^{-\alpha}\sqrt{(1-k^2)(1-h^2)}} \approx \frac{-hk}{\alpha+(k^2+h^2)/2} \quad (4)$$

In the process of accumulating the microwave energy in the cavity CA, the output coupling factor h is adjusted to be zero, i.e., h=0. In FIG. 2, the amplitudes $b_2$, $a_3$, $b_3$ and $a_2$ are nearly the same as each other, namely, $b_2 \approx a_3 \approx b_3 \approx a_2$. Thus, any of such amplitudes can be considered as representative of the amplitude of the electromagnetic oscillation in the cavity.

If it is assumed that $d|b_2/a_1|/dk=0$, the equation (3) gives $\alpha = k^2/2$. Such state is referred to as the critically-coupled state, and maximum energy is accumulated under such state. Under the critically-coupled state, the equation (3) gives $|b_2/a_1| = k^{-1}$ and the equation (2) gives $b_1 = 0$. In the equation (2), the first term represents the reflection at the inlet port, while the second term represents the reverse radiation from the inside of the cavity CA to the inlet side. When the inlet is critically-coupled with the cavity CA, the first term and the second term of the equation (2) cancel out each other, so that the entire incident power is accumulated in the cavity CA.

The extraction of a microwave pulse from the cavity CA will be considered now. To effectively extract the microwave pulse by suddenly increasing the output coupling factor after supplying the microwave energy to the cavity CA under the above-mentioned critically-coupled state, the transient phenomena at the cavity CA must be analyzed. In the arrangement of FIG. 2, the amplitude $a_2(t)$ of the electromagnetic field apparently satisfies the following conditions.

$$a_2(t) = -e^{-\alpha}\sqrt{1-h^2}\, b_2(t-t_0)$$

Here, $t_0$ is the time for the energy to make one round trip in the cavity CA, and it is given by $$t_0 = 2\pi(\lambda_g/\lambda_0)^2/\omega,$$

$\omega$ being the resonant angular frequency. If the approximation of $b_2(t-t_0) \approx b_2(t) - t_0 db_2(t)/dt$ is assumed, the following differential equation can be derived from the equations (1).

$$\frac{db_2}{dt} + \frac{b_2}{2\tau} = j\frac{k}{t_0}a_1 \quad (5)$$

$$\tau = \frac{t_0/2}{\alpha+(k^2+h^2)/2} \quad (6)$$

here, $\tau$ is the time constant of the cavity CA.

For simplicity, if the output coupling factor is assumed to increase at the time t=0 from zero to h(>0), the initial value of the amplitude $b_2$ of the electromagnetic field at the time t=0 becomes $b_2 = ja_1/k$. If it is further assumed that $k \ll h \ll 1$, then for t>0 $a_1$ can be assumed to be nearly zero, i.e., $a_1 \approx 0$. Accordingly, the relation of $b_2 = ja_1 e^{-t/2\tau}/k$ can be derived from the equation (5). By using the equations (1) again, one can derive the expression of the output $b_4 = -ha_1 e^{-t/2\tau}/k$. Thus, the output is maximized at the time t=0 with a maximum pulse power gain of $|b_4/a_1|^2 = h^2/k^2 \gg 1$. If the values of the time constant before and after the switching for the output pulse extraction are expressed by $\tau_0$ and $\tau$, the following relations can be derived from the equation (6); namely, $\tau_0 = t_0/2k^2$, $\tau = (t_0/2)/(k^2+h^2/2)$. Thus, the pulse power gain can be given by $$\left|\frac{b_4}{a_1}\right|^2 = \frac{h^2}{k^2} = 2\left(\frac{\tau_0}{\tau} - 1\right) \approx \frac{2\tau_0}{\tau} \quad (7)$$

Accordingly, the maximum value of the output pulse power is about twice the ratio of cavity time constants before and after the above switching. It is noted that extraction of the entire energy accumulated in the cavity will take a time longer than the time constant $\tau$.

Equations defining the relationships among various parameters in the two-port cavity of FIG. 2 and the method of measuring them will be discussed now.

The physical meanings of the parameters $\alpha$, k and h used in the equation (1) are clear, but they cannot be measured directly, so that it is necessary to relate them to measurable quantities such as the time constants and the quality factor Q. To begin with, the unloaded quality factor $Q_U$ will be considered. The power consumption in the cavity is proportional to the attenuation of the electromagnetic energy per one round trip therein, i.e., $1-e^{-2\alpha} \approx 2\alpha$. Thus, from the definition of the quality factor Q, the unloaded quality factor can be expressed as $Q_U = A/\alpha$. In a similar manner, the external quality factor Q on the input side is given by $Q_{E1} = 2A/k^2$, while the external quality factor Q on the output side is given by $Q_{E2} = 2A/h^2$. Here, A is a constant peculiar to the cavity CA, as will be explained hereinafter.

Mathematical expressions for the above external quality factors Q will now be derived. When the Poynting flux on the cross section of the cavity is designated by W and the energy density there is designated by E, the group velocity $v_g$ there is given by W/E. The power consumption there equals to $-dW/dz$. Accordingly, the unloaded Q value is given by $$Q_U = \frac{\omega_0 E}{P} = -\frac{\omega_0 E}{dW/dz} = -\frac{\omega_0 E}{v_g dE/dz}$$

Solving the above equation, on can get $E \propto \exp(-\omega_0 z/v_g Q_U)$, and the attenuation $\alpha$ of the magnetic field during a round trip in the cavity is given by $\alpha = \omega_0 l/v_g Q_U$. By using the relations of $l = \lambda_g/2$ and $v_g = c\lambda_o/\lambda_g$, the following expression of the above-mentioned constant A can be derived.

$$A = \frac{\pi \lambda_g^2}{\lambda_o^2} = \frac{\pi}{1 - \left(\frac{\lambda_o}{\lambda_c}\right)^2} \quad (8)$$

Here, $\lambda_c$ is the cutoff wavelength of the waveguide forming the cavity. Since the equation (8) provides the relationship among the parameters $\alpha$, k, h, and Q, a method for determining the quality factor Q by experiments will be explained now. The input side and output side coupling coefficients $\beta_1$ and $\beta_2$ are defined as $\beta_1 = Q_U/Q_{E1}$, $\beta_2 = Q_U/Q_{E2}$. Referring to FIG. 2, when an input $a_1$ in the form of a step function is applied to the cavity at time $t=0$. The following equation can be derived by solving the equation (5).

$$\frac{b_1}{a_1} = -1 + \frac{2\beta'}{1 + \beta'} (1 - e^{-(t/2\tau)}) \quad (9)$$

$$\frac{b_4}{a_1} = 2\sqrt{\frac{\beta'\beta''}{(1 + \beta')(1 + \beta'')}} (1 - e^{-(t/2\tau)}) \quad (10)$$

$$\beta' = \frac{\beta_1}{1 + \beta_2}, \quad \beta'' = \frac{\beta_2}{1 + \beta_1}$$

Here, $\beta'$ and $\beta''$ are coupling coefficients of an equivalent one-port cavity as seen from the input side and the output side respectively. When the time increases to infinity, i.e., $t \to \infty$, $b_1/a_1$ are denoted by p and q respectively, then the above coupling coefficients $\beta'$ and $\beta''$ can be expressed as follows: namely, $$\beta_1 = \frac{\beta'(1 + \beta'')}{1 - \beta'\beta''}, \quad \beta_2 = \frac{\beta''(1 + \beta')}{1 - \beta'\beta''} \quad (11)$$

here, $$\beta' = \frac{1 + q}{1 - p}, \quad \beta'' = \frac{q^2}{2(p + 1) - q^2}$$

Now, it is possible to determine the input port and output port coupling coefficients $\beta_1$ and $\beta_2$ from the equation (11) by using the measured values of the quantities p and q. Of course, when $\beta_2 = 0$, the cavity becomes a one-port cavity which is suitable for accumulating the input microwave energy.

Further, the quality factor of the load $Q_L$ is determined by measuring the time constant $\tau$ and using the relation of $\tau = Q_L/\Omega_0$. In general, the microwave detector has square detecting characteristics, so that it is not convenient to use the equations (10) and (11). To avoid this problem, if the input amplitude $a_1$ is returned to zero stepwise at $t = t_1 >> \tau$, and if the equation (5) is solved for $t > t_1$, then both $b_1/a_1$ and $b_4/a_1$ become proportional to $\exp[-(t - t_1)/2\tau]$. Hence, when either of such signals is measured by a detector of square characteristics, the decay time constant $\tau$ can be determined and then the load quality factor $Q_L$ can be calculated.

In view of the relationship $Q_L^{-1} = Q_U^{-1} = Q_{E1}^{-1} + Q_{E2}^{-1}$, one can determine the unloaded quality factor $Q_U$ by using the equation $Q_U = Q_L(1 + \beta_1 + \beta_2)$. Further, the quality factors $Q_{E1}$ and $Q_{E2}$ can be determined by the relationship of $Q_{E1} = Q_U/\beta_1$ and $Q_{E2} = Q_U/\beta_2$. Once the quantities $Q_U$, $Q_{E1}$ and $Q_{E2}$ are determined, the fundamental parameters $\alpha$, k, and h of the cavity can be calculated by using the equation (8).

Rearrangement of the pulse power gain equation (7) by using the quality factors Q gives $h^2/k^2 = Q_{E1}/Q_{E2} = Q_U/Q_{E2}\beta_2$. Accordingly, when the input energy is accumulated by keeping the input coupler under its critically-coupled conditions and if, after steady state is reached, the coupling coefficient of the output coupler is suddenly changed from zero to $\beta_2$, an output pulse with a power gain of $\beta_2$ times the input power can be obtained, or a pulse power gain of $\beta_2$ can be achieved.

FIG. 3 shows the relationship between the power gain expected by the above operation and the decay time constant $\tau$ after the conversion while using the quality factor $Q_U$ as the parameter. In practice, when $Q_U = 10^7$, if it is desired to obtain an output pulse with a power gain of $10^3$ by the switching method, the time constant for the conversion must be reduced to the order of 0.5 $\mu$s. The shorter this time constant is, the larger the output pulse will be.

II. EXPERIMENTS

The apparatus and method which have been used in the fundamental experiments of the above microwave pulse source of the invention will be explained now.

(II-1) Preparation of cavity

A cylindrical cavity of TE$_{011}$ mode capable of producing a comparatively large unloaded quality factor $Q_U$ was used, and its resonant frequency was designed at 2.85 GHz. Both the diameter and the length of the cylindrical cavity were selected to be the same at 13.85 cm. The material of the cavity was pure copper with a resistivity of $1.72 \times 10^{-8}$ $\Omega$m at room temperature, and its calculated unloaded quality factor $Q_U$ at room temperature was $Q_U = 5.58 \times 10^4$. The cavity material which was actually used was oxygen-free high-conductivity copper, and the cylindrical portion and end disk portions were made separately and their lead-platings were also conducted separately. Lead was the material for making the cavity to act as a superconducting cavity.

It is a general practice to produce a lead cavity by electroplating on a copper body in a lead borofluoride bath. The process consisted of three steps; namely, a pretreatment for cleaning and activating the copper body, plating in a bath, and a post-treatment for removing the residues from the plated surface. In the pretreatment, the copper body was immersed and boiled in an alkaline degreasing solution for 20–30 minutes so as to remove contamination from the surface to be plated. After being washed with water from public waterwork, the copper body was washed with an acid solution for 1–2 minutes so as to remove oxide film therefrom. Then, it was washed with pure water and tinplated with electrodeless plating.

The tin-plating was to facilitate the lead-plating, and in addition, it was expected to supplement the lead-plating. More particularly, the tin-plating through the electrodeless process could provide metal plating even at those portions where the lead-plating is difficult to apply. The thickness of the tin-plating was 1 $\mu$m at most. The transition temperature of tin is 3.7 K., so that it become superconducting when cooled at a reduced pressure.

After the tin-plating, the copper body was dipped in a borofluoric acid solution for 30 seconds to activate the plated surface, and it was transferred immediately thereafter to a lead-plating solution. As the lead-plating solution, 20 l of lead borofluoride solution of special grade on the market was used. Lead ions are easily bonded with ions, such as $Cl^-$ and $SO_4^{-2}$, so as to produce precipitations. Accordingly, water from public water-work cannot be used in the lead-plating process, and pure water must be used for that purpose. As the anode for the lead plating, lead with a purity of 99.99% was used in the form of plate for plating the disk portions and in the form of a rod for plating the cylindrical portion. The thickness of the lead-plating was 10-20 μm.

The vessel of the lead-plating solution bath was placed on a magnetic stirrer so as to mechanically agitate the solution therein, and pH of the lead-plating solution was kept less than 1.0 by adding borofluoric acid therein from time to time. A small amount of glue was added therein as an inhibitor for preventing development of whisker-like crystals. Since the quality of the plated metallic film depends on current density, a current density of 1.2 $A/dm^2$ was used based on experience, and an inter-electrode spacing of 1.5-4 cm was used. A plating current was applied to it in a forward direction for 6 minutes for plating, and in a reverse direction for 30 seconds for effecting the electropolishing, and such plating and electropolishing were repeated in a cyclic manner. After applying the current for about one hour in the above cyclic manner, lead film of 10-20 μm thickness was deposited.

If the polarity of the power source at the beginning of the lead plating is not in the forward direction, there is a risk that the plated thin tin films may be dissolved. Thus, due care must be paid to the power source polarity.

After the above process of plating, the plated body was thoroughly washed with pure water. If the plating solution remains in holes or grooves of the plated body, such remaining solution often spreads out later to spoil the plated metallic film, so that care should be taken to avoid plating solution residues on the surface of the plated body. Finally, moisture was removed by replacing it with methyl alcohol and then with ethyl alcohol, and the body was dried in vacuo. During the assembling process of various parts, it was preferable to avoid contact with air as far as possible for preventing oxidation, however, for simplicity, the actual assembling as done in air as quickly as possible and then the cavity was loaded in a metallic cryostat and evacuated by vacuum pump. To seal joints between adjacent parts, indium wire with a diameter of 1 mm or 2 mm was used.

(II-2) Cryostat and vacuum pump means

FIG. 4 diagrammatically illustrates a cryostat which was made of stainless steel and designed by the inventors for holding the above-described cavity therein. The cryostat has a sidewall portion and a top flange portion, and the latter portion can be moved vertically by a crane (not shown) installed on the floor. The sidewall portion carries a liquid nitrogen ($LN_2$) tank $NT_1$ with a capacity of 20 l and an evacuating hole connecting to pump $PM_3$, and it is connected to a bottom wall. The top flange portion carries a second liquid nitrogen ($LN_2$) tank $NT_2$ with a capacity of 10 l and a liquid helium (LHe) tank HT with a capacity of 20 l suspended therefrom. The cavity CA is disposed in the helium tank HT while keeping its axial center line horizontal. A 30 cm long liquid level indicator (not shown) and a germanium (Ge) thermometer (not shown) for checking the temperature of the cavity CA are mounted on the liquid helium tank HT. The tanks carried by the top flange portion are thermally shielded by applying super insulators, or highly effective insulating layers, thereon.

To check the performance of the cryostat of the above structure, various heat inflows were estimated. The heat inflow through the above-mentioned insulating layers due to heat radiation therethrough was estimated to be 104 mW, under the assumptions that the liquid helium tank HT was at 4.2 K. and the liquid nitrogen tanks $NT_1$ and $NT_2$ were at 7.7 K. In the actual cryostat, however, the liquid helium tank HT was wrapped with a super insulator having ten layers of aluminum foil, so that the heat inflow due to the heat radiation therethrough was very small and practically negligible. When the degree of vacuum in the insulating layer was $10^{-6}$ Torr, the heat conduction through the residual gas therein was found to be negligible. Consequently, the major source of the actual heat inflow was through the heat conduction in the metallic material forming the evacuating pipes and various lead wires. The net heat inflow considering the above heat conduction and the cooling due to evaporation of helium from liquid to gas was estimated to be 152 mW.

The process through which the cavity was actually operated in the experiments was as follows. Before transferring liquid helium (LHe) into the vessel, it was precooled for about two hours by pouring liquid nitrogen ($LN_2$) in it. After complete removal of liquid nitrogen ($LN_2$), liquid helium (LHe) was poured therein. About 18 l of liquid helium (LHe) was stored in the helium tank HT by using about 30 l of liquid helium in the above-described manner. After such storing, the amount of helium evaporation from the liquid helium was measured by the liquid level indicator, and the rate of evaporation was found to be 0.2 l per hour, which corresponded to a heat inflow of 145 mW. This was in fairly good agreement with the above-mentioned estimate of 152 mW determined by calculation. The experiments could be conducted from the time of pouring the liquid helium (LHe) until the upper portion of the cavity CA was exposed.

Thus, the duration in which the experiments were possible was more than ten hours, but the actual time of experiments was shorter than that because most of the experiments were conducted at temperatures below 4.2 K. after cooling at a reduced pressure. As to the vacuum pumping of the cryostat and the cavity, preliminary pumping was made at a high speed by a mechanical booster pump $PM_3$ until vacuum pressure of about $10^{-3}$ Toor was reached. The pump was switched to a turbo molecular pump (not shown) with an evacuating speed of 270 l/s and vacuum pressure of about $10^{-4}$ Torr was reached. Then, the heat-insulating layers of the cryostat were evacuated to about $1 \times 10^{-6}$ Torr by running a molecular pump $PM_1$ for several hours, while the cavity CA was evacuated to the order of $10^{-7}$ Torr by continuously running an ion pump $PM_2$ with an evacuating speed of 20 l/s for several days.

(II-3) Microwave circuit

Since a superconducting cavity is used, the frequency stability of the microwave oscillator is required to be less than about 1 KHz in terms of the cavity band width. To meet this requirement, the microwave circuit in the pulse source of the invention uses a built-in automatic frequency control (AFC) circuit. As well known in the art, the AFC circuit in the microwave frequency range uses the phase characteristics of reflected wave from the cavity.

More particularly, the AFC action in this frequency range uses the sensitive phase variation of reversely-radiated signals from the cavity at frequencies above and below the resonant frequency. In practice, however, the coaxial cable from the measuring point to the cavity extends more than 2 meters, so that the phase of the reflected wave from the input coupling port varies depending on the frequency, and the frequency of the oscillator is unintentionally controlled by such phase change at the input port. Thus, there is a need for a means that detects the phase of only those signals which are reversely radiated from the inside of the cavity and eliminates the waves reflected from the input port of the cavity.

In the experiments, the AFC action relied on the circuit means as shown in FIG. 5. The microwave toward the cavity CA in the cryostat was divided into two portions by a power divider PD, so that one of the two divided portions was applied to the cavity CA, while the remaining portion was delivered to one end of a cable (not shown) through a phase shifter PS. The opposite end of the cable was left open so as to cause total reflection of signal there. The phase shifter PS was adjusted in such a manner that, when the totally reflected signal arrives at the power divider PD, the signal reflected by the input port of the cavity CA is cancelled by the above totally reflected signal from the opposite end of the cable. Whereby, only the reversely-radiated signal from the inside of the cavity CA was extracted.

Output microwave from a radio-frequency oscillator RO was used in the form of continuous wave (CW) when applied to the cavity CA for energy accumulation therein, while the incident microwave was modulated by a signal of rectangular waveform when applied to the measurement of time constant and the like. A part of the output microwave from the oscillator RO was applied to an automatic frequency control circuit AFC through a directional coupler DC as a reference wave for the AFC action, and the remainder of the output microwave from the oscillator RO was delivered to the cavity CA. The reversely-radiated signal from the cavity CA was applied to a phase detector (not shown) in the automatic frequency control circuit AFC through the power divider PD and the circulator CL. The output from the phase detector was amplified by DC amp (not shown) and then fed back to a control signal input terminal of the radio-frequency oscillator RO.

More specifically, the output from the phase detector was at first terminated by a 50 Ω matching load, amplified by a factor of 20 through DC amplification, and applied to a low-pass filter for elimination of noises and other spurious components. Up to this stage, its central voltage was 0 V. Since the control voltage of the radio-frequency oscillator RO had a central voltage of $-10$ V, the thus treated output signal from the phase detector was amplified by a factor of about 6 while shifting its central voltages, so as to make it into a control voltage of the radio-frequency oscillator RO.

It was noted that the AFC action was effective only for those frequency fluctuations which were slower than the time constant of the above-mentioned low-pass filter, and it was not effective for high-frequency noises. If, however, the time constant of the low-pass filter was made short, the AFC action becomes unstable. Especially, when the microwave output was modulated by rectangular waveform, it was easy to become unstable. In any case, a high-frequency stability of the radio-frequency oscillator RO itself was essential, and the AFC action should be used as an auxiliary means.

The output voltage from the phase detector or a coaxial crystal detector in the AFC circuit used in the experiments of the invention must be calibrated by a microwave power meter and should be used after converted into power. Especially, the phase detector is used under saturated conditions by selecting a high reference signal level, so as to ensure output voltage from the cavity CA to be proportional to the RF voltage. On the other hand, the output voltage from the coaxial crystal detector is proportional to the RF power when the RF input is at a low level of below 0.1 mW, but it is proportional to the RF voltage when the RF input is higher than that. In the experiments, the constants of the cavity CA were measured at low levels, but during the experiments of the microwave pulse extraction, they were naturally at high levels.

(II-4) Input/output portion of the cavity

FIG. 1 shows a cross sectional view taken at the central portion of the cylindrical cavity used in the experiments. The input coupling portion and the evacuating port should be so formed as to minimize their disturbance on the electromagnetic field distribution in the cavity. When the input microwave was delivered to the input coupling portion depicted on the right-hand side of the figure, the degree of coupling was adjusted by changing the distance between the tip of a coaxial cable and semicircular metallic loop mounted on the inside surface of the cavity.

The output coupling portion depicted on the left-hand side of FIG. 1 is the key element of the invention. In the process of accumulating the continuous microwave of small power in the cavity CA over a certain period of time, when the input power balances the power consumption in the cavity CA, equilibrium is reached. To accumulate a large amount of microwave energy, the loss in the cavity CA and the leakage to the output circuit must be reduced as far as possible. In the process of extracting a microwave pulse, switching should be made in such a manner that the coupling between the output circuit and the cavity CA is made as large as possible at a speed as fast as possible.

In the present invention, a discharge plasma is used to effect the above-mentioned switching. Since the rising time of a gaseous discharge can be made less than several ns, and if the plasma produced by the gaseous discharge is used to form an output antenna, an antenna equivalent to a metallic antenna can be built in the cavity CA at an extremely high speed. During the energy accumulating period, only the glass tube and sealed gas of the discharge tube stay in the cavity CA as inactive elements, so that the presence of the discharge tube hardly disturbs the quality factor Q of the cavity CA.

However, a high voltage of several kV or higher is necessary to initiate the discharge and the discharge current is several tens of Amperes or more, so that the discharge noise is likely to exert adverse effects on the observation of the microwave. More particularly, the voltage applicable to the microwave detector is only up to several V. Besides, a connecting cable, whose length is not negligible as compared with the wavelength of the microwave, affects the circuit impedance and may cause mismatching of the output circuit. Accordingly, it is not desirable to connect only a regular high-voltage feeder line directly to the discharge tube for an antenna. To solve such problems, it is necessary to separate the path of the discharge current from that of the microwave.

The inventors noted that the discharge current and the microwave are different in frequency and that the frequency of the microwave is constant, and the inventors have succeed in separating the paths of the discharge current and the microwave by using quarter-wavelength stubs which showed different impedances to them. FIG. 6 shows the formation of a cavity output circuit which was used in the experiments. A micro strip line was formed on a glass epoxy substrate with a relative specific dielectric constant of about 4.8, and the impedance of the micro strip line was set at 50 $\Omega$, so that its width was 3 mm and its wavelength contraction factor was 0.53, resulting in a quarter-wavelength of 14 mm.

As an antenna to be formed by the discharge tube, a circular one-wavelength loop antenna with an impedance of about 100 $\Omega$ was conceived, and diametrically opposite points of the loop antenna were grounded so as to use only one half of it as a half-wavelength antenna with an impedance of about 50 $\Omega$. When a 50 $\Omega$ coaxial cable was directly connected to such antenna, fairly good matching was obtained.

A quarter-wavelength open stub was connected to the high-voltage side electrode of the discharge tube, so that it was insulated from the ground as far as DC was concerned but it was equivalent to a grounded point as far as microwave was concerned. Accordingly, when a high-voltage feeder was connected to the high-voltage side electrode of the discharge tube, the microwave system was not affected at all. On the other hand, the ground side electrode 61 of the discharge tube was grounded through a quarter-wavelength short stub. Whereby, the discharge current was directed to flow from the electrode 61 to the ground 62, while the microwave was directed toward the output cable. The microwave output signal was thus extracted to the outside of the cryostat, and applied to a band-pass filter BF with a central frequency of 2.850 GHz and a band width of $\pm 50$ MHz. Thus, only the microwave component of the output signal was extracted and detected by a detector DT, so as to facilitate its observation by an oscilloscope cathode ray tube CRT.

III. ANALYSIS OF THE RESULT OF EXPERIMENTS

The result of the experiments thus conducted will be analyzed now.

(III-1) Discharge tube characteristics

The discharge tube was made by using a semicircular pylex glass tube with a major radius of 12.5 mm, a minor radius of 1.5 mm and an inside diameter of 2 mm. Metallic electrodes, each with a diameter of about 1 mm, were mounted to opposite ends of the pylex glass tube, and pure helium gas of 50 Torr at room temperature was sealed therein. A pulse voltage to be applied across the electrodes at the opposite ends of the discharge tube was generated by the discharge from a 0.002 $\mu$F discharge capacitor (not shown). The peak value of the discharge current was controlled by the charging voltage of the discharge capacitor. The peak value of the discharge current was 52 A when the discharge capacitor was charged to 4 kV, while the discharge current peak value was 168 A when the discharge capacitor was charged to 10 kV. The discharge current increased linearly with the charging voltage of the discharge capacitor.

The duration of the discharge was about 400 ns, and the waveform of the discharge current was not affected to any significant extent by the ambient temperature change between the room temperature and the low temperature. Since the inside diameter of the discharge tube was 2 mm, the discharge current of 100 A corresponded to the current density of 32 MA/m$^2$. If the theory of positive column were assumed to be applicable to this case, the ratio between the electric field in the plasma and the gas pressure was to be determined by the product of the tube radius and the gas pressure, so that the electron drift velocity in the gas at room temperature was estimated to be $1.3 \times 10^6$ cm/s and the plasma density was estimated to be $1.5 \times 10^{16}$ cm$^{-3}$. Although such estimates were not very accurate, since the electron density corresponding to the plasma frequency at the used frequency of 2.86 GHz in this case was $10^{11}$ cm$^{-3}$, the discharge plasma had a sufficiently high electron density, and the discharge plasma could be assumed to be equivalent to a metallic conductor as far as the microwave was concerned.

Figure 7:
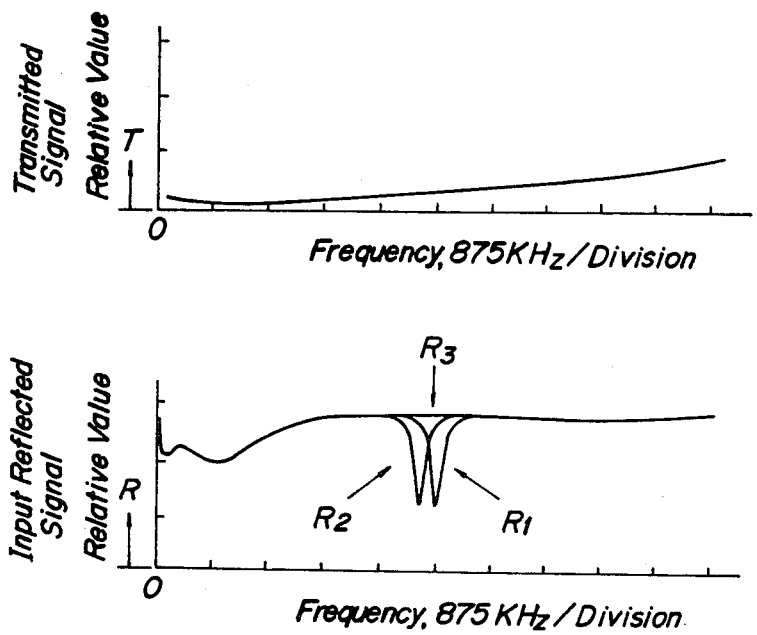
FIG. 7 is a graph showing the variation of the resonant frequency of the resonant cavity when a discharge tube is connected thereto.

The curves of FIG. 7 show the result of observation of change in the resonant frequency of the cavity at room temperature before and after the mounting of the discharge tube. In the figure, the abscissa represents the frequency with a scale of 875 kHz per division. The curves of the graph B represent the reflected signals at the input port, and the curve $R_1$ is for the case without the discharge tube, and the curve $R_2$ is for the case with the discharge tube. As can be seen from those curves, the resonant frequency was reduced by about 220 kHz by the presence of the discharge tube. The width and the depth of the absorption curve at the resonant point were not affected by the presence of the discharge tube. Thus the loaded quality factor Q was not changed by the presence of the discharge tube, and the cavity characteristics were not affected thereby.

Special contrivance was necessary with respect to the positions of the discharge tube electrodes and the shapes of holes bored through the cavity, so as to ensure that the output coupling coefficient $\beta_2$ to be zero during the energy accumulating period despite the presence of the discharge tube. The curve $R_3$ of the figure represents the reflected signals when the discharge tube is replaced by a copper loop of similar shape and similar dimension. As can be seen from the curve, the replacement with the copper loop caused reduction in the loaded quality factor, elimination of the resonance, and appearance of broad transmitted signals on the output side of the copper loop as shown by the curves T.

Accordingly, if a high density plasma is generated in the discharge tube, the output side external quality factor $Q_{E2}$ is sufficiently reduced, so that it can be safely assumed that satisfactory switching operation is carried out by the generation of the high density plasma.

(III-2) Effect of discharge on radio-frequency output circuit from the cavity A pulse current of about 100 A flows through the discharge tube at the time of discharge, so that considerable noises are induced in adjacent circuit elements. Noise voltage waveforms at the circuit elements 61 through 64 in the radio-frequency output circuit of FIG. 6 were checked by the oscilloscope CRT. During the checking, the discharge capacitor (not shown) was charged to 10 kV. Despite the direct connection to the ground conductor 62 of the quarter-wavelength micro strip line, a noise voltage with a peak value of about 20 V due to the discharge was observed at the discharge tube electrode 61 and the earth point 62 in FIG. 6, and if such noise voltage had been directly applied to the detector DT, the detector DT might have been broken. After being filtered at the band-pass filter BF, the noise voltage peak value was reduced to about 1 V at both the input point 63 and the output point 64 of the detector DT.

In the checking of the noise voltage, the fluctuation of the ground voltage might have affected the operation of the oscilloscope. The geometrical rectilinear distance between the discharge tube DS and the detector DT in the circuit of the noise voltage measurement was less than 50 cm. However, in the experiment the electric circuit from the discharge tube DS to the oscilloscope CRT included about a 1 m long coaxial cable between the discharge tube DS and the band-pass filter BF and another coaxial cable of about 2 m length between the detector DT and the oscilloscope CRT, and the noise voltage was finally reduced to about 100-400 mV and there was no practical difficulty caused by the noise voltage.

The output coupling portion was brought out to the room temperature atmosphere, and microwave was reversely applied from the output circuit to the cavity CA, so as to measure the radio-frequency electric field distribution in the above-mentioned open stub and the short stub. The measuring method was to form an antenna by extending one end of the core wire of a semi-rigid coaxial cable with a small diameter, connecting the opposite end of the coaxial cable to the detector DT, moving the antenna along the stubs, and observing the output of the detector DT by the oscilloscope CRT. The result showed satisfactory radio-frequency electric field distribution, so that it was confirmed that the output coupling portion performed as expected.

(III-3) Power standing wave ratio of discharge tube antenna

The characteristics of the antenna formed of the discharge plasma was checked. The duration of the discharge current in the discharge tube DS is less than 1 μs and very short, but the discharge plasma remains in the discharge tube DS for a short period after the discharge, so that the period in which the discharge plasma acts as an antenna is expected to be longer than the duration of the discharge current. As a method to confirm the antenna action of the discharge plasma, microwave was reversely fed from the microwave output cable to the discharge tube DS and the reflected wave was observed. When there was no discharge plasma, only the quarter-wavelength short stub was connected to the output cable, and total reflection occurred at the junction to the short stub. On the other hand, when a discharge plasma was generated in the discharge tube DS, the coaxial cable was matched with the discharge plasma, and a part of the microwave reversely fed was radiated to the space from the antenna formed by the discharge plasma, so as to reduce the reflected wave. In fact, the antenna action of the plasma discharge was observed by the above method.

An example of the above observation is shown in FIG. 8A. The measurement of the figure was carried out by placing the discharge antenna not in the cavity CA but in a free space at room temperature. The abscissa of the graph of the figure represents the sweep time with a scale of 2 μs per division, and the upper curve in the figure represents the discharge current at a scale of 150 A per division. The discharge capacitor (not shown) was charged to 9 kV during the observation. The lower curve in the figure represents the reflected signal from the discharge plasma antenna. During the discharge, the signal could not be observed due to the above-mentioned noises, but it was found that the reflected wave was greatly reduced by the generation of the discharge plasma and such condition lasted for a few μs. With such observation, the antenna action of the discharge plasma was confirmed.

FIG. 8B shows the summary of the above observation. The abscissa of the graph of the figure represents the charging voltage of the discharge capacitor. It is known that the initial value of the plasma density in the discharge plasma antenna is substantially proportional to this charging voltage of the discharge capacitor, so that the antenna action at different initial plasma densities can be measured by observing the reflected signals while changing the charging voltage of the discharge capacitor. The minimum values of the reflected signals observed in readable range were converted into power standing wave ratios (PSWR) as represented by the hollow circles in FIG. 8B. The values of the reflected waves observed 5 μs after the peak time of the discharge current were converted into the PSWR's as represented by the solid circles in FIG. 8B. The power standing wave ratio (PSWR) for the reflected signal with a power reflection coefficient R is given by $PSWR = (1+R)/(1-R)$.

The dashed line curve in FIG. 8B shows the PSWR's which were observed when the discharge tube was replaced by similarly shaped metallic antenna, and the observed values of PSWR of the metallic antenna were 1.9. As can be seen from the figure, with the increase of the charged voltage, the PSWR's of the discharge plasma antenna became small and its antenna characteristics improved. If it is assumed that the antenna action is available as long as the PSWR of the reflected signals is less than a minimum value 3, i.e., the power reflection coefficient is less than 50%, then the charged voltage must be above 4.5 kV. When the charged voltage was higher than 6 kV, the hollow circles showed substantially the same values as that of the metallic antenna. Besides, for the charged voltage in excess of 6 kV, the electron density in the discharge plasma is high and the duration of the antenna action tends to increase with the charged voltage. This tendency is reflected in the observation that the solid circles in FIG. 8B representing the PSWR's 5 μs after the peak time of the discharge decreases with the increase of the charging voltage.

It may be assumed from the above observation that, when the discharge plasma antenna is disposed in the cavity CA for extraction of the microwave pulses, if the charged voltage of the discharge capacitor is below 6 kV, the antenna characteristics of the discharge plasma will become inferior and the peak value of the output microwave pulse will be reduced.

(III-4) Extraction of microwave pulse from room temperature cavity

As preliminary experiments, the discharge tube DS was mounted on the lead cavity CA at room temperature and the microwave pulse was extracted therefrom. In this case, the energy accumulating time $\tau_o$ in the equation (7) is of the same order as the energy extraction time and a high pulse power gain cannot be expected, but the experiments are important in that the switching action can be confirmed.

Various constants of the cavity CA were measured by the method explained in the above paragraph (III-2), and the result showed the resonant frequency of 2.8595 GHz, the time constant $\tau$ of 580 ns, the input side coupling coefficient $\beta_1=0.374$, and the output side coupling coefficient $\beta_2=0$. With such constants, the unloaded quality factor $Q_U$ becomes $Q_U=1.43\times 10^4$. Continuous microwave was fed to such cavity CA for accumulation of energy, and then discharge was caused in the discharge tube.

FIG. 9A shows an example of the experiments. The abscissa of the graph of the figure represent the sweep time with a scale of 1 $\mu$s per division, and the upper curve in the figure represents the discharge current with a scale of 150 A per division. The discharge capacitor (not shown) was charged to 9 kV during the observation. The lower curve in the figure represents the output waveform of the microwave. During the discharge, the observation was impossible due to the above-mentioned noises, but clear microwaves appeared thereafter. It was assumed that the microwave energy continued to flow into the cavity from the input side even during the period as long as the discharge plasma was present, so as to maintain a steady state. Transmitted signals from the incoming microwave continue until the antenna action disappears, so that the waveform of the microwave output pulse substantially indicates the period of the presence of the discharge plasma antenna. The pulse output signals of FIG. 9A correspond to the reflected signals from the antenna in FIG. 8A.

FIG. 9B shows the relationship between the peak value of the microwave pulse output power and the charging voltage of the discharge capacitor (not shown). During the experiments, the input microwave power entering the input coupling portion as shown on the right-hand side of FIG. 1 was 4 mW. The peak value of the microwave power appearing at the output coupling portion as shown on the left-hand side of FIG. 1 was plotted on the ordinate of FIG. 9B. As can be expected from the result of the measurement of the antenna constants in the preceding paragraph (III-3), if the charging voltage of the discharge capacitor is below 7 kV, the discharge plasma antenna characteristics becomes so inferior that the microwave pulse output power is reduced, but when the above-mentioned charging voltage is higher than 7 kV, sufficient antenna action is ensured and the output peak value becomes constant.

As can be seen from the comparison of FIG. 8B and FIG. 9B, satisfactory operation of the discharge plasma antenna can be expected only when the charging voltage of the discharge capacitor is above 7 kV or when the power standing wave ratio PSWR for the discharge plasma antenna is in good agreement with those for the metallic antenna. It is noted that even a slight increase in the PSWR results in a reduction of the microwave peak power.

FIG. 9B also shows that the microwave peak output power was much smaller than the continuous microwave input, but when the cavity CA is cooled to the sufficiently low temperature for making it super-conducting while keeping other conditions unchanged, the unloaded quality factor increases and an increase in the microwave peak output power can be expected.

(III-5) Extraction of microwave pulse from super-conducting cavity

When the lead cavity CA used in the preceding paragraph (III-4) is cooled by liquid helium to make it superconducting, its unloaded quality factor $Q_U$ is so increased that the accumulated microwave energy increases even if the input microwave is kept the same as that in the case of the room temperature. Various constants of the superconducting cavity CA at 4.2 K. were measured. The resonant frequency was 2.868 GHz and it increased by 8.5 MHz as compared with that at room temperature due to the shrinkage of the cavity CA. The time constant was 93 $\mu$s, the input coupling coefficient $\beta_1=1.0$, and the output coupling coefficient $\beta_2=0$. With such constants, the unloaded quality factor $Q_U$ became $Q_U=3.4\times 10^6$, which was 200 times that at the room temperature.

After accumulating microwave energy in such superconducting cavity CA, microwave pulses were extracted therefrom by causing the above-mentioned discharge. In this case, the conditions of $\tau_0>>\tau$ are applicable to the equation (7), so that a large power gain in the output pulse can be expected. FIG. 10A shows the relationship between the peak value of the output microwave pulses and the charging voltage of the discharge capacitor (not shown). In the measurement of the data of the figure, the input microwave applied to the superconducting cavity CA was 1.85 mW.

As in the case of room temperature, when the charging voltage of the discharge capacitor was less than 7 kV, the power of the output microwave pulse decreased. Since the trend in the measured data of FIG. 10A was similar to that of FIG. 9B, it can be safely assumed that the discharge plasma antenna functioned at the very low temperature in the same manner as at room temperature. When the charging voltage was higher than 7 kV, the output microwave power was saturated at 130 mW, and the power gain of the output pulse in this case was 70 times.

The waveform of FIG. 10B was that of the output microwave pulse in the case when the maximum power gain was obtained. In this case, the pressure in the surrounding of the cavity CA was reduced to 180 Torr and the temperature there was reduced to 3 K., so that the tin coating applied to the surface of the cavity CA by electrodeless process was possibly made superconducting too. The superconducting cavity CA had a time constant of 110 $\mu$s and an internal quality factor $Q_U=3.8\times 10^6$. The charging voltage for the case of FIG. 10B was 8.5 kV. In view of the large power of the output microwave pulse, a fixed resistance attenuator of coaxial type was used in the output circuit in this case. Since the output signal was large, the effect of the noise due to the discharge became comparatively small. For the continuous microwave input of 1.85 mW fed to the cavity, the power of the output microwave pulse from the output coupling portion was 660 mW, so that the power gain of the output pulse was 350 and very large.

The time constant as determined by the signal waveform of FIG. 10B was $\tau=175$ ns. If this time constant and the above unloaded quality factor $Q_U=3.8\times 10^6$ are used while considering the calibration curves of FIG. 2, the expected value of the power gain of the output pulse turned out to be about 1,000. The actual power gain obtained in the case of FIG. 10B was about one third of the expected gain as calculated above. As the reason for it, the following factors can be considered. In the equation (7) giving the power gain of the pulse, the output coupling coefficients were assumed to vary in the form of a step function, but finite time is necessary in actual change in the degree of coupling. More particularly, about 200 ns was necessary for the discharge current to reach the peak value, and this time is comparable to the time necessary for producing the discharge plasma antenna. The time necessary for producing the discharge plasma cannot be made sufficiently shorter than the cavity time constant 175 ns after the switching. This seems to be a possible reason for the actual pulse power gain being smaller than that of the equation (7).

Further, in the initial stage of the discharge current rise, the electron density in the discharge plasma is not sufficiently high, so that a microwave loss possibly occurs in the discharge plasma during this initial stage.

(III-6) Practicability of the microwave pulse source of the invention

As can be seen from the equation (7), the pulse power gain is proportional to the unloaded quality factor $Q_U$ of the superconducting cavity. The actual value of the unloaded quality factor $Q_U = 3.8 \times 10^6$ obtained in the above experiments is not so good, because the inventors once obtained $Q_U = 2.9 \times 10^7$ in other experiments. To check whether or not the presence of the switching discharge tube reduced the unloaded quality factor $Q_U$ in the experiments described herein, the unloaded quality factor $Q_U$ was measured again after removing the discharge tube, but there was no significant change. Thus, the reason for the low value of the unloaded quality factor $Q_U$ seems to be in the incompleteness of the plating process and the insufficient degree of vacuum.

If it is assumed that the above-mentioned discharge switching were made by using the cavity with the unloaded quality factor $Q_U = 2.9 \times 10^7$, a pulse power gain of about 2,800 might have been obtained. An article in the magazine "PHYSICA" Volume 54, (1971), Page 137 reported that an unloaded quality factor $Q_U = 8.3 \times 10^9$ was obtained by using a similar S band lead cavity of $TE_{011}$ mode, which cavity was like the one used in the above experiments described herein. If it is further assumed that the above-mentioned discharge switching were made by using the cavity the unloaded quality factor $Q_U = 8.3 \times 10^9$, a pulse power gain of $8 \times 10^5$ times might have been obtained. However, whether such cavities are applicable to the pulse source of the invention is not definite yet.

Accordingly, the limit of the microwave pulse obtainable by the method used in the above experiments will be analyzed now. The limit of the electromagnetic energy which can be accumulated in the cavity depends on the transition to normal conductivity due to radio-frequency magnetic field and the radio-frequency insulation breakdown. In general, the critical electromagnetic field intensities for the above transition and breakdown are considered to be of the same order, and the problem of which of them is more severe than the other depends on various factors, such as the superconducting materials, the frequency, the structure of the cavity, and the like, and there is no clearcut conclusion for that problem yet.

The critical radio-frequency magnetic field for lead is of the order of 800 Gauss, which corresponds to an energy density of 2.6 kJ/m$^3$. This value will be used here as the limit for the energy accumulation. Since the volume of the cavity used in the above experiments was $2 \times 10^{-3}$ m$^3$, the upper limit of the energy accumulation therein would have been 5.2 J. If it is assumed that a cavity with the unloaded quality factor $Q_U = 2.9 \times 10^7$ as once obtained by the inventors is available, a continuous microwave input with a power of 6.6 kW is necessary for accumulation of the above limit energy under the conditions of critical coupling. If the above discharge switching of the above experiments were applied to the cavity which runs under such critical conditions, a microwave pulse with a peak pulse power of 19 MW and a duration of 200 ns would be generated as far as the calculation is concerned.

However, such microwave pulse might cause radio-frequency insulation breakdown in the output circuit, so that both the input and the output power might be required to remain about $10^{-3}$ times the above critical powers. Thus, the theoretical limits of the pulse source of the invention would be continuous microwave input with a power of several W, and a microwave pulse output with a power of several tens of kW.

In the above experiments, an S band microwave with a frequency of 2.8 GHz was used. For this frequency band, there are inexpensive microwave generators available as high-power microwave sources, such as magnetrons and the like. Accordingly, practical application of the microwave pulse source of the invention will be valuable in the millimeter wave band with a frequency in excess of 30 GHz. From such view point, the inventors now plan to develop a microwave pulse source with a frequency of 23 GHz and an output of several kW.

As to the time constant of the superconducting cavity, it is about 1 second at the longest. Thus, it does not make any sense to apply the present invention to the generation of microwave pulse with a duration longer than 1 second, as can be seen from the equation (7). If a pulse power gain in the order of $10^3$ is desired, the duration of the output microwave pulse should be less than 1 ms. If the duration is limited to less than 1 μs, practical application of the microwave pulse source of the invention will be very valuable. The liquid helium and the cryostat used in the above experiments of the invention are economical as compared with devices required by other microwave pulse generators, such as high-voltage sources and strong magnetic field coils required by gyrotrons.

In the above experiments, the gas pressure of helium sealed in the discharge tube for the discharge switching was 50 Torr at room temperature. Although when the microwave energy density in the cavity is small the gas pressure of such order will not cause spontaneous discharge. If the pulse source of the invention is actually applied to practical apparatus, a higher energy density will be used and the gas pressure will be required to be reduced. Thus, the discharge switching will be close to the vacuum switching.

In conclusion, the microwave source of the invention is more economical and practical than other microwave sources when applied to millimeter radars and scientific experiments.

IV. EFFECTS

As described in the foregoing, a microwave pulse souce according to the invention uses a combination of a superconducting cavity and a discharge switch. For instance, a superconducting lead cavity of $TE_{011}$ mode with a resonant frequency of 2.868 GHz is used to provide an unloaded quality factor $Q_U$ of $3.8 \times 10^6$ at 3 K., and a small semicircular discharge tube is coupled to said superconducting cavity so as to define an output coupling circuit in such a manner that, the output coupling circuit is switched on by a pulse discharge in the discharge tube which pulse discharge suddenly produces a high density plasma therein for increasing the output coupling coefficient, whereby a pulse power gain in excess of 350 times is obtained by producing, e.g., an output microwave pulse of 660 mW with a half-width of 175 ns from continuous input microwave of 1.85 mW. Thus, the microwave pulse source of the invention is simple in construction and is formed from comparatively inexpensive circuit elements, and yet it renders outstanding effects of easily producing microwave pulses of very large power from continuous input microwave at an extraordinarily high power gain.

Although the invention has been described with a certain degree of particularly, it is understood that the present disclosure has been made only by way of example and that numerous changes in details of construction and the combination and arrangement of parts may be resorted to without departing from the scope of the invention as hereinafter claimed.

What is claimed is:

1. A microwave pulse source, comprising a superconducting cavity having an input port and an output port, an input coupler disposed at said input port, an output coupler disposed at said output port, said output coupler including a discharge tube which loops into said cavity in such a manner that the degree of coupling of said output coupler is suddenly maximized upon occurrence of a discharge plasma in said discharge tube and microwave energy flows from said cavity via said discharge plasma, the cavity having a time constant whose value when said output coupler has a minimum degree of coupling is substantially longer than that when said output coupler has a maximum degree of coupling, whereby input microwave energy with a certain power delivered at said input port is accumulated in said cavity when said output coupler has the minimum degree of coupling and an output microwave pulse with a much larger pulsed power than said power of the input microwave energy is extracted from the output port of said cavity when the degree of coupling of said output coupler is suddenly maximized by causing a discharge plasma at said discharge tube.

2. The microwave pulse source of claim 1, wherein said discharge tube has first and second ends with first and second electrodes disposed respectively at said first and second ends; and further comprising high voltage means connected to said first electrode for applying a high voltage to cause said discharge plasma, said high voltage means providing a discharge current through said tube; transmission line means connected to said second electrode for conveying microwave energy from said discharge tube; and separation means connected to said first and second electrodes for separating the paths of the microwave energy and the discharge current.

3. The microwave pulse source of claim 2, wherein said separation means comprises an open stub connected to said first electrode and a shorted stub connected to said second electrode.

4. The microwave pulse source of claim 3, wherein said discharge tube is arcuate in shape and has a length of $\lambda/2$, $\lambda$ being the wavelength of the microwaves, and wherein said separation means comprises a $\lambda/4$ open stub connected to said first electrode and a $\lambda/4$ shorted stub connected to said second electrode.

5. The microwave pulse source of claim 4, wherein at least one of said stubs is a micro strip line.

* * * * *